(12) United States Patent
Kim et al.

(10) Patent No.: US 7,422,916 B2
(45) Date of Patent: Sep. 9, 2008

(54) METHOD OF MANUFACTURING THIN FILM TRANSISTOR PANEL

(75) Inventors: Bo-Sung Kim, Seoul (KR); Yong-Uk Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 394 days.

(21) Appl. No.: 11/125,911

(22) Filed: May 10, 2005

(65) Prior Publication Data

US 2005/0287692 A1    Dec. 29, 2005

(30) Foreign Application Priority Data

Jun. 29, 2004    (KR) ...................... 10-2004-0049566

(51) Int. Cl.
*H01L 21/00* (2006.01)
(52) U.S. Cl. .................. 438/30; 438/142; 438/149; 257/E21.001; 257/E21.703; 257/E21.372
(58) Field of Classification Search .............. 438/30
See application file for complete search history.

(56) References Cited

U.S. PATENT DOCUMENTS

| | | | |
|---|---|---|---|
| 5,652,633 A * | 7/1997 | Lee ............... | 349/42 |
| 7,110,075 B2 * | 9/2006 | Tak et al. ........... | 349/129 |
| 7,151,279 B2 * | 12/2006 | Jun et al. .......... | 257/72 |
| 2002/0186332 A1 | 12/2002 | Kwak et al. | |
| 2006/0250538 A1 * | 11/2006 | Kim ................ | 349/43 |
| 2006/0258059 A1 * | 11/2006 | Seo et al. ............ | 438/128 |

FOREIGN PATENT DOCUMENTS

| | | |
|---|---|---|
| JP | 2002184999 | 6/2002 |
| JP | 2002341382 | 11/2002 |
| JP | 2003234353 | 8/2003 |
| JP | 2003234355 | 8/2003 |
| KR | 100309925 | 9/2001 |
| KR | 1020010084330 | 9/2001 |
| KR | 1020010091119 | 10/2001 |
| KR | 1020020036023 | 5/2002 |
| KR | 1020020056111 | 7/2002 |
| KR | 1020030064975 | 8/2003 |
| KR | 100413668 | 12/2003 |
| KR | 100416853 | 1/2004 |

* cited by examiner

*Primary Examiner*—Walter Lindsay, Jr.
*Assistant Examiner*—Abdulfattah Mustapha
(74) *Attorney, Agent, or Firm*—Cantor Colburn LLP

(57) ABSTRACT

A method of manufacturing a thin film transistor panel is provided, which includes forming a first signal line on a substrate. The method also includes forming in sequence a first insulating layer and a semiconductor layer on the first signal line. The method further includes patterning the semiconductor layer and the first insulating layer through one photolithography process to form a patterned semiconductor layer and a patterned first insulating layer. The method also includes forming a second signal line on the patterned semiconductor layer and the patterned first insulating layer.

25 Claims, 16 Drawing Sheets

METHOD OF MANUFACTURING THIN FILM TRANSISTOR PANEL

This application claims priority to Korean Patent Application No. 2004-0049566, filed on Jun. 29, 2004, the contents of which in its entirety are herein incorporated by reference.

BACKGROUND OF THE INVENTION

1. Field of the Invention

The present invention relates to an improved method of manufacturing a thin film transistor panel.

2. Description of Related Art

In order to reduce the size of semiconductor devices, something which is becoming increasingly important in the semiconductor industry, signal lines within these devices are being formed within multi-layers. The insulating layers of the conventional semiconductor devices are generally formed of material having low permittivity in order to minimize any interference of signals transmitted via the signal lines. Also, the signal lines formed in different layers are electrically connected to each other via contact holes.

Flat panel display devices, such as liquid crystal display (LCD) devices and organic light emitting display (OLED) devices, adopt the semiconductor devices and structures of organic insulating layers to control pixels. In particular, in order to increase their aperture ratio, the display devices employ pixel electrodes formed to overlap the signal lines. Also, in order to decrease their parasitic capacitance, the display devices employ an insulating layer between the pixel electrode and the signal line, which is made of organic material having the low permittivity.

Generic organic layers having photosensitivity (also referred to as photosensitive organic layers) are used and formed into desired shapes through exposing and developing processes without using a separate etching process. When photosensitive organic layers are patterned, their required thickness is about 4.6-4.7 µm or more in consideration of a decrease in the thickness during, or as a result of, patterning of other layers. The amount of light required for patterning the photosensitive organic layers is about 3-4 times greater than that required for patterning generic photosensitive layers, thereby increasing the exposing time. In considering the time required for implementing a photolithography process, the total combined processing time is substantial, which may result in diminished productivity. In addition, the amount of organic material consumed increases, as well as the amount of clean up time due to, e.g., removing the deposits of organic material on the etching devices, which in turn, may cause the costs of production to increase.

What is needed, therefore, is a more efficient way to manufacture thin film transistor panels.

SUMMARY OF THE INVENTION

The above disadvantages and shortcomings are overcome or alleviated by a method of manufacturing a thin film transistor panel. In a first embodiment, the method includes forming a first signal line on a substrate. The method also includes forming in sequence a first insulating layer and a semiconductor layer on the first signal line. The method further includes patterning the semiconductor layer and the first insulating layer through one photolithography process to form a patterned semiconductor layer and a patterned first insulating layer. The method also includes forming a second signal line on the patterned semiconductor layer and the patterned first insulating layer.

The method may further include applying the second insulating layer on the second signal line; and pattering the second insulating layer.

The second insulating layer may be made of organic material, and a thickness of the first insulating layer may be about 2.500 Å to 5.500 Å.

The method may further include forming a third insulating layer made of inorganic material under the second insulating layer. At this time, the second and the third insulating layers may be patterned using one photolithography process.

The second insulating layer may have photosensitivity. At this time, the difference between a thickness to which the second insulating layer is applied and a thickness after the third insulating layer is patterned may be about 1,000 Å to 2,000 Å. In addition, a thickness of the first insulating layer may be 2,500 Å to 5,500 Å, a thickness of the second insulating layer in the applying step of the second insulating layer may be 4,150 Å to 4,250 Å, and a thickness of the third insulating layer my be 1,000 Å to 2,000 Å.

The first insulating layer may have a first contact hole exposing a portion of the first signal line, and the second insulating layer may have a second contact hole located on the first contact hole.

The second insulating layer may have a third contact hole exposing a portion of the second signal line. The method may further include forming a pixel electrode be connected to the second signal line via the third contact hole on the second insulating layer.

The method may further include forming a contact assistant be connected to the first signal line via the first and the second contact holes on the second insulating layer.

In another embodiment, the method includes forming a first signal line on a substrate. The method also includes forming in sequence a first insulating layer and a semiconductor layer on the first signal line. The method further includes patterning the semiconductor layer and the first insulating layer through one photolithography process to form a patterned semiconductor layer and a patterned first insulating layer, the patterned first insulating layer having a first contact hole to expose a portion of the first signal line. The method also includes forming a second signal line on the patterned semiconductor layer and the patterned insulating layer. The method also includes applying a second insulating layer on the second signal line, and patterning the second insulating layer to have a second contact hole at the substantially same location as the first contact hole.

The patterning of the semiconductor layer and the first insulating layer may include applying a photosensitive layer having thicknesses of two or more on the semiconductor layer; forming the first contact hole by etching the semiconductor layer and the first insulating layer using the photosensitive layer as an etching mask; and removing the photosensitive layer.

The patterning of the semiconductor and the first insulating layer may include applying a photosensitive layer on the semiconductor layer; exposing to light the photosensitive layer through a mask having a slit pattern; developing the photosensitive layer; forming the first contact hole by etching the semiconductor layer and the first insulating layer using the photosensitive layer as an etching mask; and removing the photosensitive layer.

The semiconductor layer may have an intrinsic semiconductor layer and an extrinsic semiconductor layer.

The second insulating layer may be made of organic material. In addition, the method may further include applying a third insulating layer made of inorganic material under the second insulating layer.

The method may further include exposing to light the first signal line through the first contact hole by removing the third insulating layer exposed after patterning the second insulating layer.

The second insulating layer may have photosensitivity. At this time, the difference between a thickness to which the second insulating layer is applied and a thickness after the third insulating layer is patterned may be about 1,000 Å to 2,000 Å. In addition, a thickness of the first insulating layer is 2,500 Å to 5,500 Å, a thickness of the second insulating layer in the applying step of the second insulating layer is 4,150 Å to 4,250 Å, and a thickness of the third insulating layer may be 1,000 Å to 2,000 Å.

The method may further include forming a contact assistant be connected to he first signal line exposed on the second insulating layer, and forming a pixel electrode on the second insulating layer.

Other embodiments will be or become apparent to one of skill in the art upon review of the following drawings and detailed description. It is intended that all such additional embodiments be included within this description, be within the scope of the present invention, and be protected by the accompanying drawings.

BRIEF DESCRIPTION OF THE DRAWINGS

The present invention will become more apparent by describing embodiments thereof in detail with reference to the accompanying drawings in which.

DETAILED DESCRIPTION OF THE INVENTION

Figure 1:
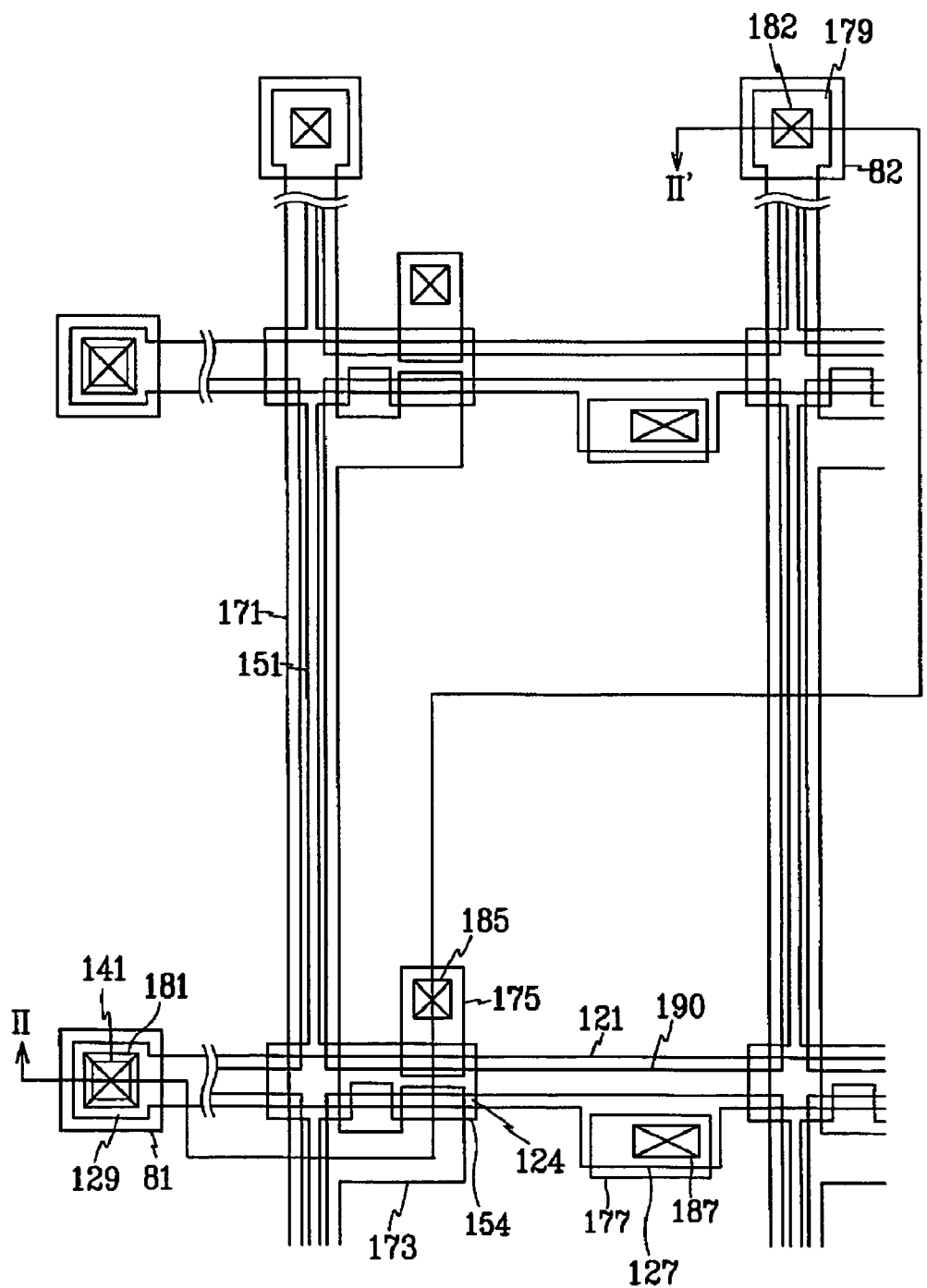
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, and regions with respect to the thin film panel have been exaggerated for purposes of clarity. It will be understood that when an element such as a layer, film, region or substrate is referred to as being "on" another element, it will be construed as being either directly on the other element or that intervening elements may also be present. In contrast, when an element is referred to as being "directly on" another element, it will be construed such that there are no intervening elements present.

In accordance with exemplary embodiments, a method of manufacturing a thin film panel is provided. The method of manufacture includes pre-etching a film that requires etching with an organic layer, thereby reducing the consumption amount of organic materials required in a manufacturing process. The pre-etching is simultaneously performed for multiple films, thereby minimizing the time associated with performing a photolithography process.

Figure 2:
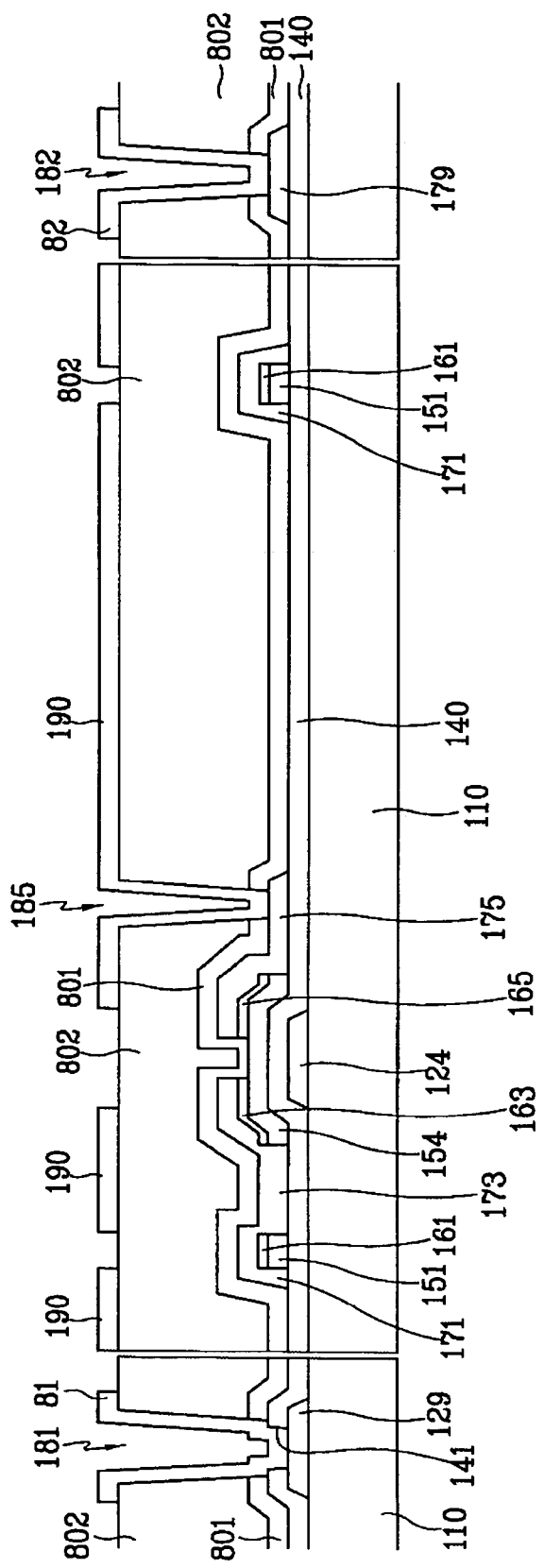
FIG. 2 is a sectional view of the TFT array panel shown in FIG. 1 taken along line II-II'.

Turning now to FIGS. 1 and 2, a thin film transistor (TFT) array panel for an LCD in accordance with an exemplary embodiment will now be described. It will be understood that the TFT array panel may be employed with other types of display devices such as OLED. In particular, FIG. 1 is an exemplary layout view of a TFT array panel according to an embodiment of the present invention, and FIG. 2 is a sectional view of the TFT array panel shown in FIG. 1 taken along line II-II'.

A plurality of gate lines 121 for transmitting gate signals are formed on an insulating substrate 110. Each of the gate lines 121 extends substantially in a transverse direction of the TFT array panel. A plurality of gate electrodes 124 are formed at selected positions of each gate line 121. Each gate line 121 includes a plurality of projections 127 protruding downward. Each gate line 121 includes an expanded end portion 129 having a large area for contact with another layer or an external device.

The gate lines 121 are, for example, made of Al containing metal such as Al and Al alloy, Ag containing metal such as Ag and Ag alloy, Cu containing metal such as Cu and Cu alloy, Mo containing metal such as Mo and Mo alloy, Cr, Ta, and Ti. However, the gate lines 121 may include two films having different physical characteristics from each other, a lower film (not shown) and an upper film (not shown) on the lower film. The upper film may be made of low resistivity metal including Al containing metal such as Al and Al alloy, Ag containing metal such as Ag and Ag alloy, and Cu containing metal such as Cu and Cu alloy. On the other hand, the lower film may be made of material such as Cr, Mo, Mo alloy, Ta and Ti, which is known to have good physical, chemical, and electrical contact characteristics with other materials such as indium tin oxide (ITO) and indium zinc oxide (IZO). An exemplary combination of the lower film material and the upper film material is Cr and Al—Nd alloy.

The lateral sides of the gate lines 121 are inclined relative to a surface of the substrate 110, and the inclination angles thereof range about 30-80 degrees.

A gate insulating layer 140 is formed on the gate lines 121. The gate insulating layer 140 has a plurality of contact holes 141 exposing the end portions 129 of the gate lines 121. In other words, each contact hole 141 exposes, in part, corresponding one of the end portions 129 of each gate line 121. The gate insulating layer 140 is made of material having, for example, silicon nitride (SiNx).

A plurality of semiconductor stripes 151, which are made of, for example, hydrogenated amorphous silicon (abbreviated to "a-Si"), are formed on the gate insulating layer 140. Each semiconductor stripe 151 extends substantially in a longitudinal direction of the TFT array panel. Each semiconductor stripe 151 has a plurality of projections 154 branched out toward the gate electrodes 124. The width of each semiconductor stripe 151 is larger near the gate lines 121 than at the remaining regions. In this embodiment, each projection 154 of the semiconductor stripe 151 has a size large enough to cover the gate electrode 124. The projection 154 of the semiconductor stripe 151 may cover a surrounding area of the gate electrode 124 as well, which includes a corresponding area of the gate line 121.

A plurality of ohmic contact stripes 161, which may be made of silicide or n+ hydrogenated a-Si heavily doped with n type impurity, are formed on the semiconductor stripes 151. Each ohmic contact stripe 161 has a plurality of projections 163 that are disposed on the projections 154 of the semiconductor stripes 151. Ohmic contact islands 165 are formed on the projections 154 of the semiconductor stripes 151. The ohmic contact islands 154 may be made of the same material as that of the ohmic contact stripes 161. A projection 163 of the semiconductor stripes 151 and an ohmic contact island 165 are disposed on a corresponding projection 154 of the semiconductor stripe 151.

The lateral sides of each semiconductor stripe 151 and the ohmic contact stripes and islands 161 and 165 are inclined relative to a surface of the substrate 110, and the inclination angles thereof are, for example, in a range of about 30-80 degrees.

A plurality of data lines 171, a plurality of drain electrodes 175, and a plurality of storage capacitor conductors 177 are formed on the ohmic contact stripes and islands 161 and 165 and the gate insulating layer 140.

Each data line 171 for transmitting data voltages extends substantially in the longitudinal direction of the TFT array panel and intersects corresponding one of the gate lines 121. A plurality of branches of each data line 171, which project toward the drain electrodes 175, form a plurality of source electrodes 173. Corresponding source electrode 173 and drain electrode 175 are separated from each other and opposite each other with respect to a corresponding gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121.

The data lines 171, the drain electrodes 175, and the storage capacitor conductors 177 are, for example, made of Mo containing metal and refractory metal such as Cr, Ta and Ti. They may include multi-layers having an upper layer having low resistivity and a lower layer having good contact characteristics. Each data line 171 includes an end portion 179 having a larger area for contact with another layer or an external device.

Like the gate lines 121, the data lines 171, the drain electrodes 175, and the storage capacitor conductors 177 have lateral sides inclined relative to the surface of the substrate 110, and the inclination angles thereof range about 30-80 degrees.

The ohmic contact stripes and islands 161 and 165 are interposed only between the underlying semiconductor stripes 151 and the overlying data lines 171 and drain electrodes 175 and reduce the contact resistance therebetween. The semiconductor stripes 151 include a plurality of exposed portions, which are not covered with the data lines 171 and the drain electrodes 175, such as portions each located between the source and drain electrodes 173 175 in a TFT. Although the semiconductor stripes 151 are narrower than the data lines 171 at most places, the width of the semiconductor stripes 151 becomes larger near the gate lines 121 as described above, to smooth the profile of the surface, thereby preventing the disconnection of the data lines 171.

A lower passivation layer 801 made of, for example, silicon nitride or silicon oxide, is formed on the data lines 171, the drain electrodes 175, the storage capacitor conductors 177, and the exposed portions of the semiconductor stripes 151. An upper passivation layer 802 is formed on the lower passivation layer 801, and is made of, for example, organic material having a good flatness characteristic.

The lower and upper passivation layers 801 and 802, respectively, have a plurality of contact holes 182, 185 and 187 exposing the end portions 179 of the data lines 171, the drain electrodes 175, and the storage conductors 177, respectively. The passivation layers 801 and 802 and the gate insulating layer 140 have a plurality of contact holes 181 exposing the end portions 129 of the gate lines 121. The lower passivation layer 801 may be omitted if it is not necessitated.

A plurality of pixel electrodes 190 and a plurality of contact assistants 81 and 82, which are made of, for example, ITO or IZO, are formed on the upper passivation layer 802.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which control arrangement of liquid crystal molecules in a liquid crystal layer (not shown) disposed between the pixel electrodes 190 and the common electrode.

A pixel electrode 190 and a common electrode form a liquid crystal capacitor, which stores applied voltages after turn-off of a TFT associated with the pixel electrode 190. An additional capacitor called a "storage capacitor," which is connected in parallel to the liquid crystal capacitor, may be provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances, are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

Optionally, the pixel electrodes 190 overlap the gate lines 121 and the data lines 171 to increase aperture ratio of the TFT array panel.

The contact assistants 81 and 82 are connected to the exposed end portions 129 of the gate lines 121 and the exposed end portions 179 of the data lines 171 through the contact holes 141, 181 and 182, respectively. The contact assistants 81 and 82 protect the exposed end portions 129 and 179 and complement the adhesion between the exposed portions 129 and 179 and external devices. When a gate driver (not shown) applying a plurality of scanning signals to the gate lines 121 is integrated on the TFT array panel, the contact assistants 81 may function as members connecting between the end portions 129 of the gate lines 121 and the gate driver. The contact assistants 81 may be omitted if they are not necessitated.

According to another embodiment of the present invention, the pixel electrodes 190 are made of transparent conductive polymer. For a reflective LCD, the pixel electrodes 190 are made of opaque reflective metal. In these cases, the contact assistants 81 and 82 may be made of material, for example, ITO or IZO different from the pixel electrodes 190.

A method of manufacturing the TFT array panel shown in FIGS. 1 and 2 according to an embodiment of the present invention will now be described in detail with reference to FIGS. 3 to 16 as well as FIGS. 1 and 2.

Figure 3:
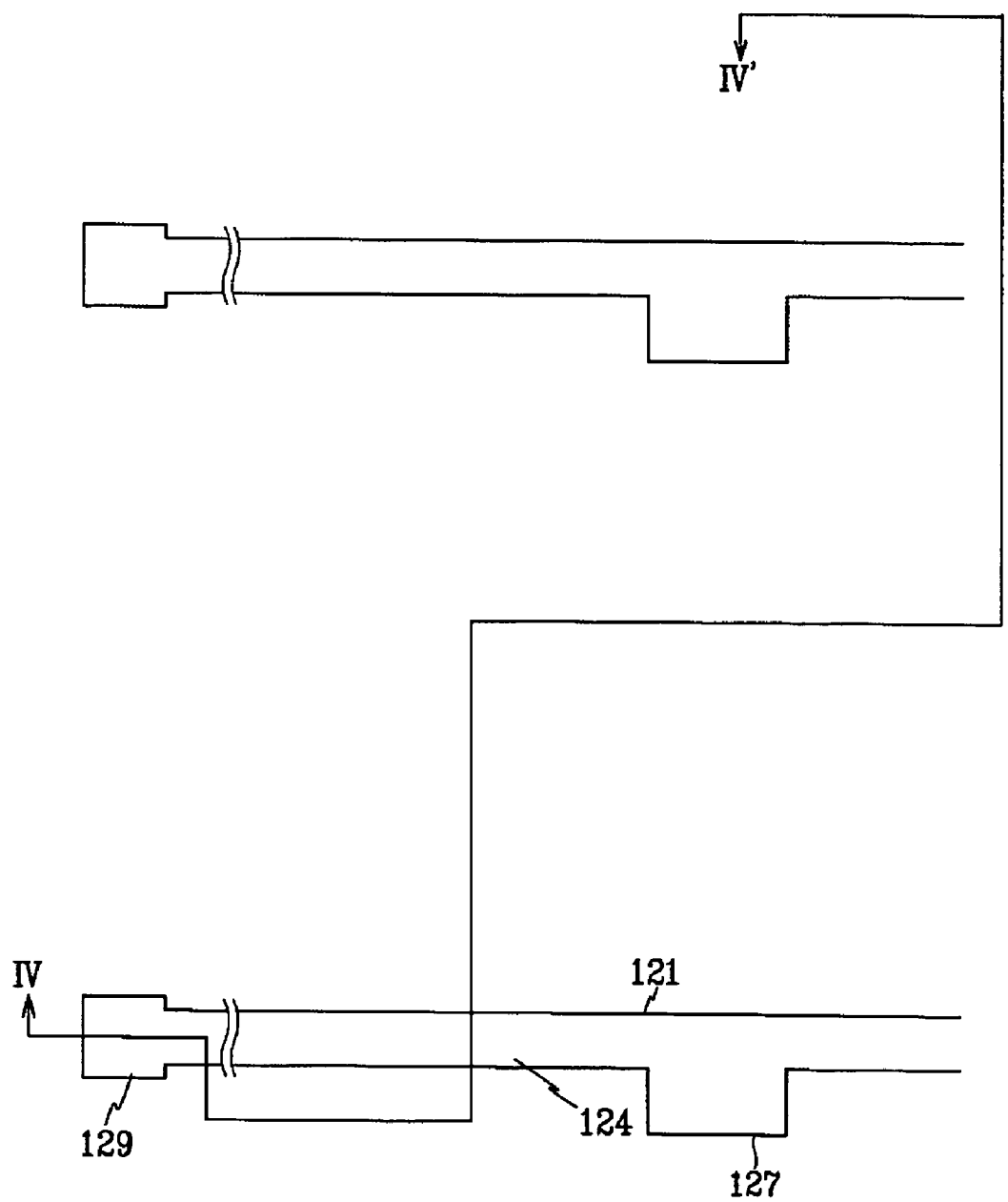
FIG. 3 is a layout view of the TFT array panel shown in FIGS. 1 and 2 in the first step of a manufacturing method thereof according to an embodiment of the present invention.
Figure 4:
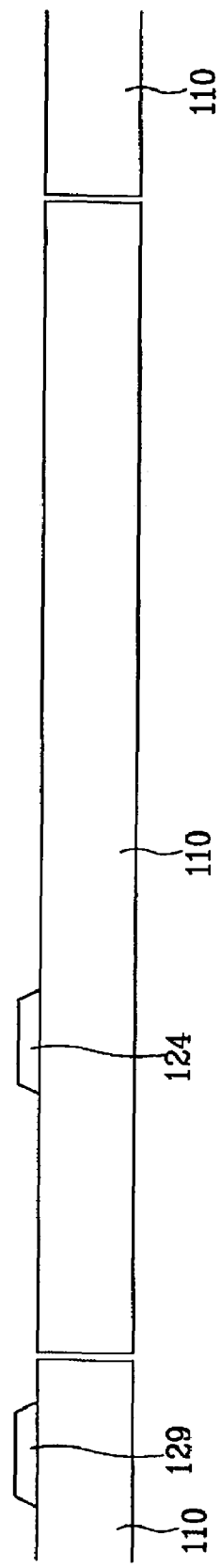
FIG. 4 is a sectional view of the TFT array panel shown in FIG. 3 taken along line IV-IV.
Figure 9:
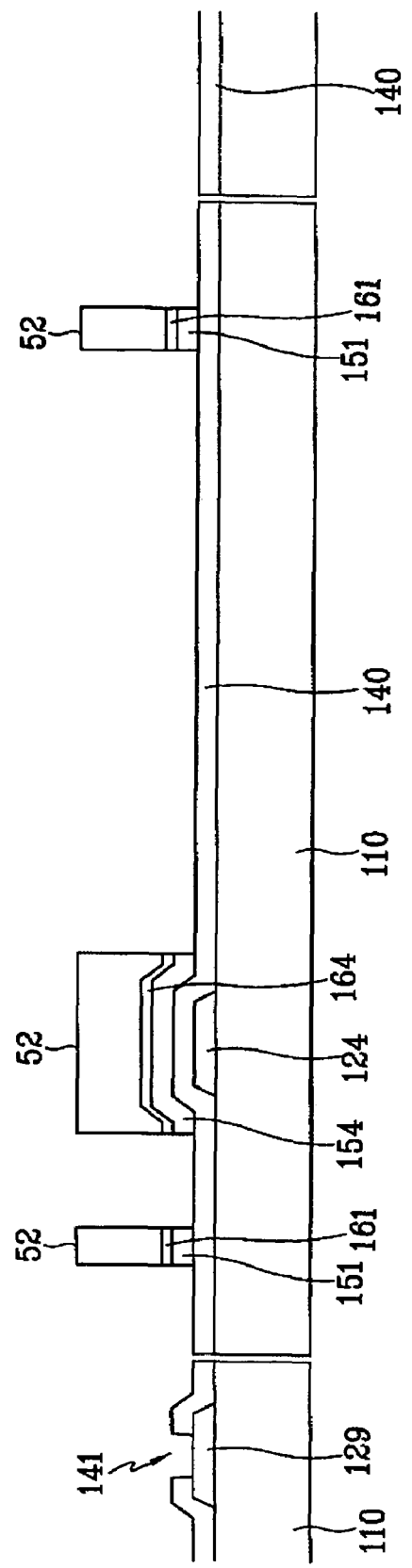
Figure 10:
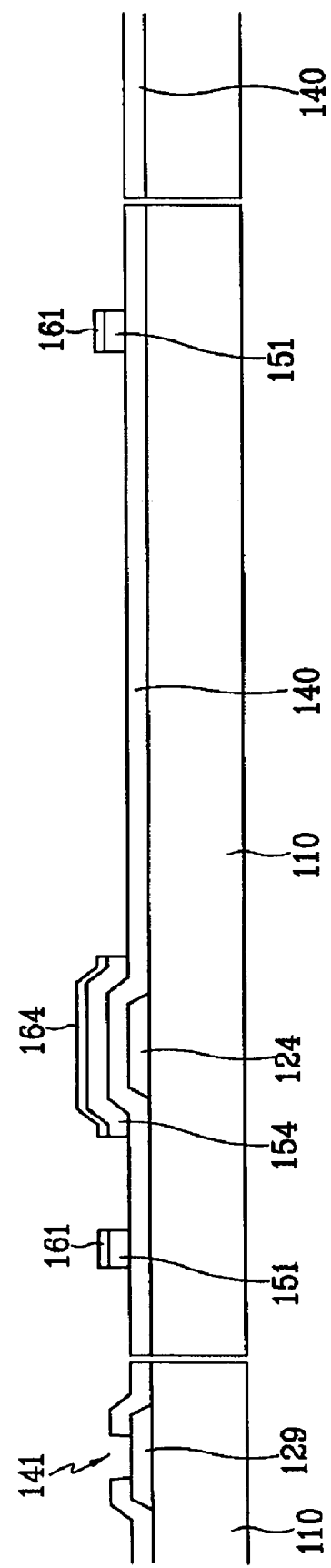
Figure 11:
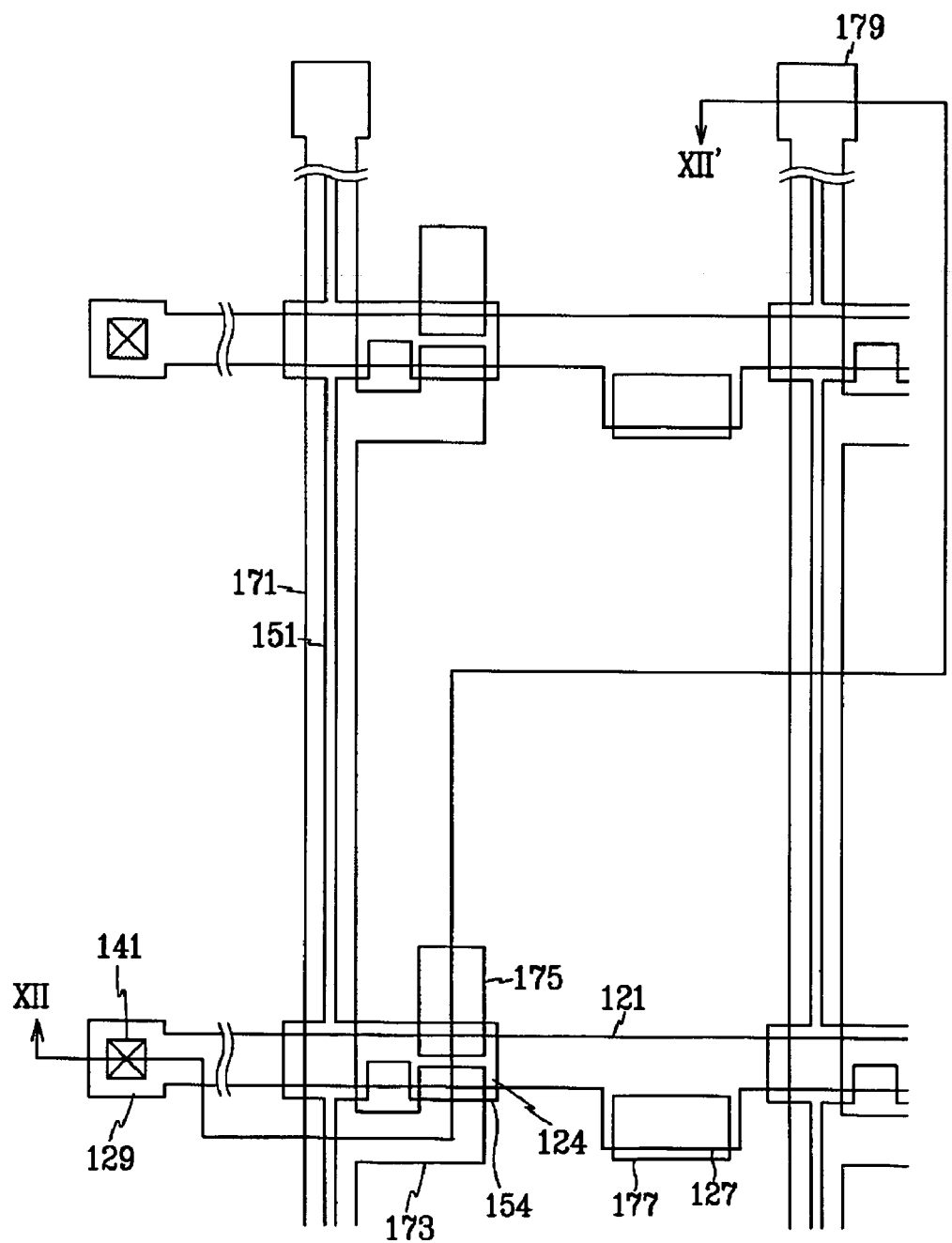
FIG. 11 is a layout view of the TFT array panel in the step following the step shown in FIG. 10.
Figure 12:
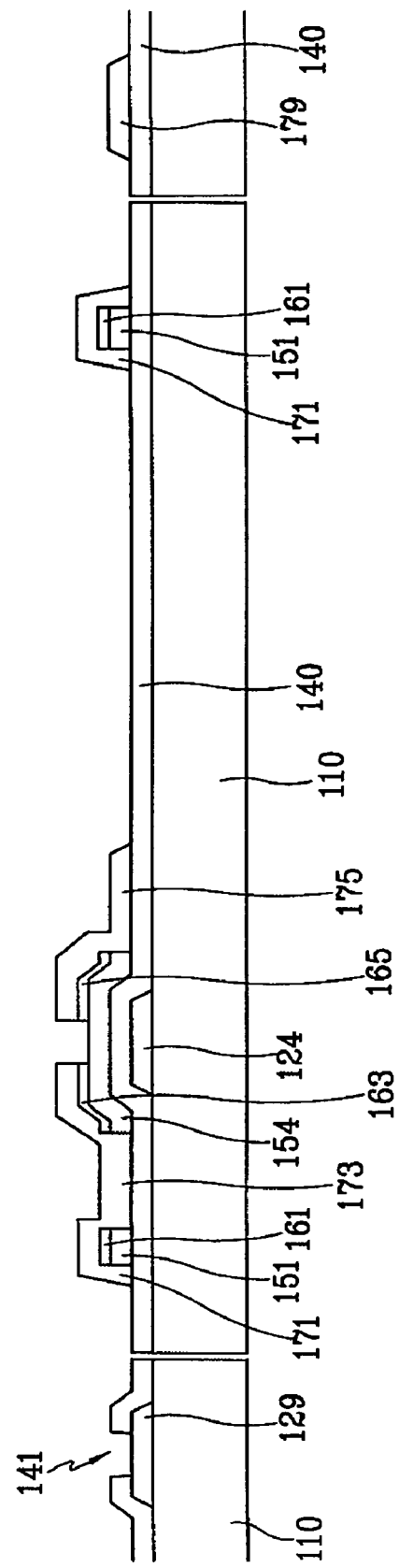
FIG. 12 is a sectional view of the TFT array panel shown in FIG. 11 taken along line XII-XII'.
Figure 13:
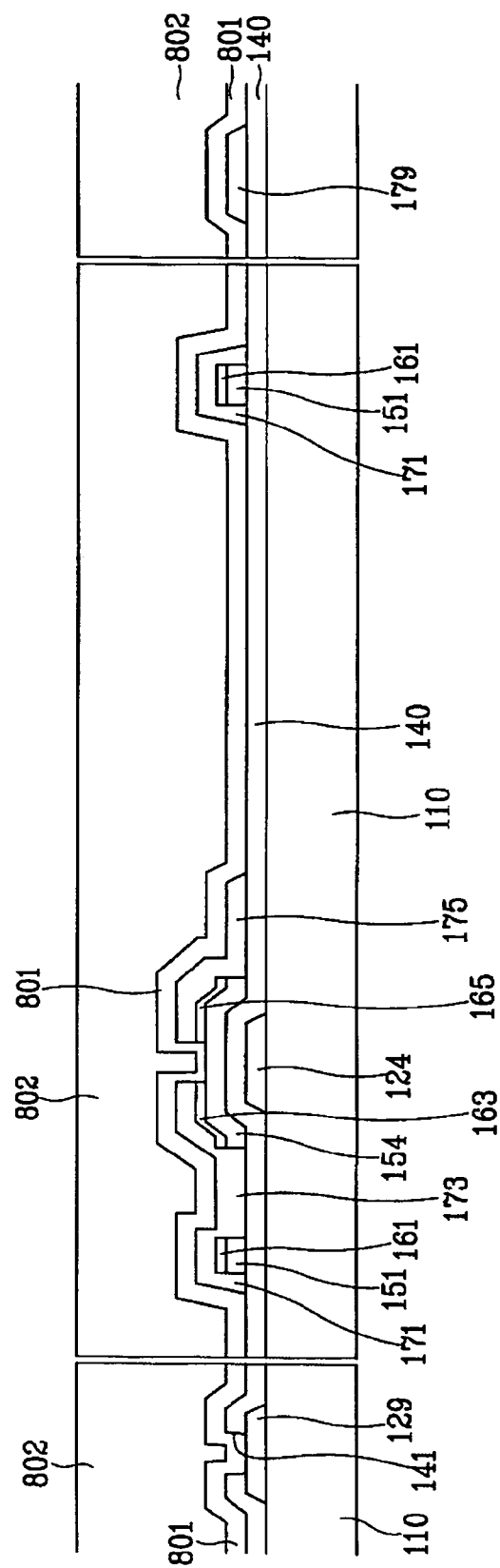
FIGS. 13 and 14 are sectional views of the TFT array panel shown in FIG. 11 taken along line XII-XII' and illustrate the step following the step shown in FIG. 12.
Figure 14:
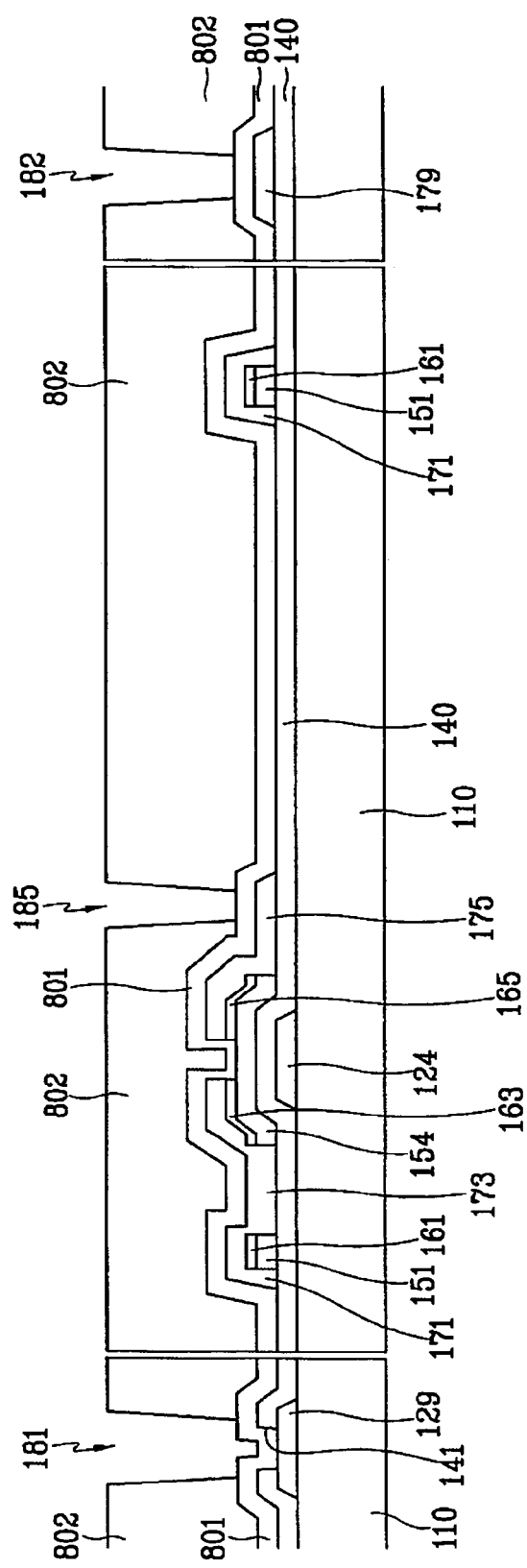
Figure 15:
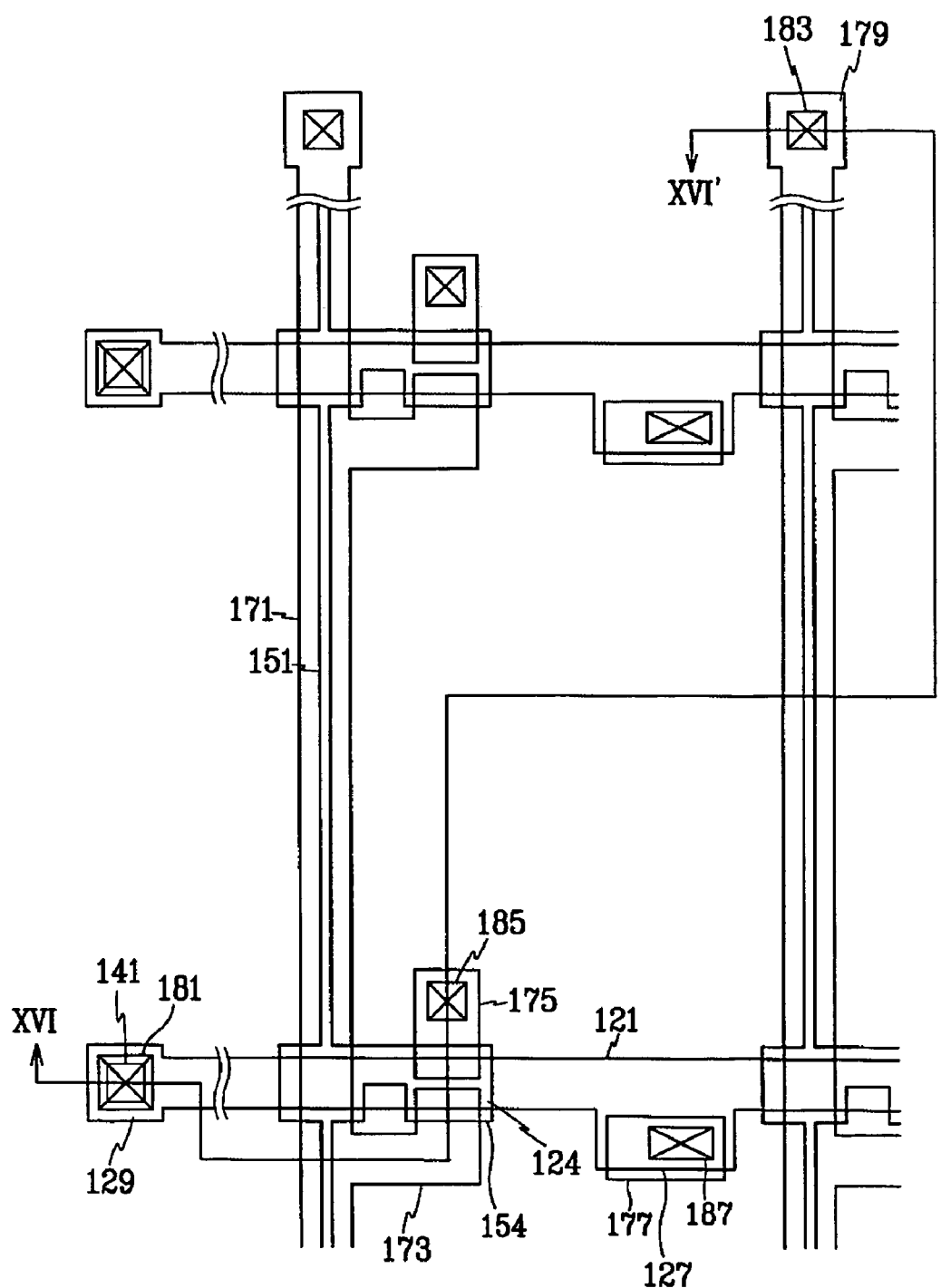
FIG. 15 is a layout view of the TFT array panel in the step following the step shown in FIG. 14.
Figure 16:
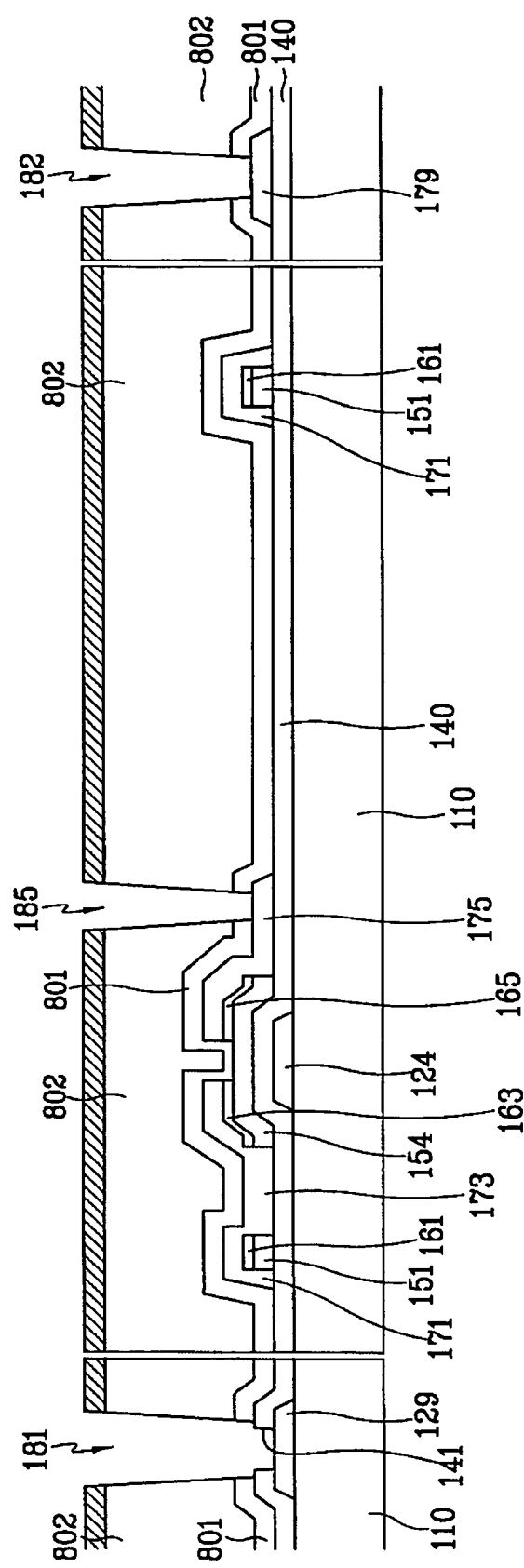
FIG. 16 is sectional view of the TFT array panel shown in FIG. 15 taken along line XVI-XVI'.

FIG. 1 is an exemplary layout view of a TFT array panel according to an embodiment of the present invention and FIG. 2 is a sectional view of the TFT array panel shown in FIG. 1 taken along line II-II'. FIG. 3 is a layout view of the TFT array panel shown in FIGS. 1 and 2 in the first step of a manufacturing method thereof according to an embodiment of the present invention. FIG. 4 is a sectional view of the TFT array panel shown in FIG. 3 taken along line IV-IV, and FIGS. 5 to 10 are sectional views of the TFT array panel shown in FIG. 3 taken along line IV-IV' and illustrate the step following the step shown in FIG. 4. FIG. 11 is a layout view of the TFT array panel in the step following the step shown in FIG. 10 and FIG. 12 is a sectional view of the TFT array panel shown in FIG. 11 taken along line XII-XII'. In addition, FIGS. 13 and 14 are sectional views of the TFT array panel shown in FIG. 11 taken along line XII-XII' and illustrate the step following the step shown in FIG. 12, and FIG. 15 is a layout view of the TFT array panel in the step following the step shown in FIG. 14. FIG. 16 is sectional view of the TFT array panel shown in FIG. 15 taken along line XVI-XVI'.

Referring to FIGS. 3 and 4, a conductive film is sputtered on an insulating substrate 110 such as transparent glass. The conductive film is patterned by photo-etching to form a plurality of gate lines 121 including a plurality of gate electrodes 124 and a plurality of projections 127. Each gate line 121 includes a plurality of projections 127 protruding downward. Each gate line 121 includes an expanded end portion 129 having a large area for contact with another layer or an external device (not shown). The lateral sides of the gate lines 121 are inclined relative to a surface of the substrate 110, and the inclination angles thereof range about 30-80 degrees.

Figure 5:
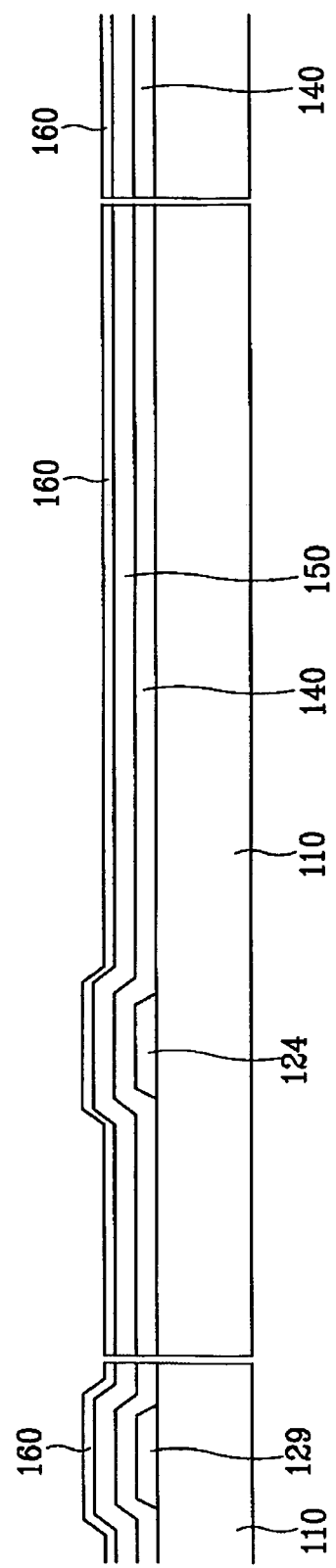
FIGS. 5 to 10 are sectional views of the TFT array panel shown in FIG. 3 taken along line IV-IV' and illustrate the step following the step shown in FIG. 4.

Referring to FIG. 5, a gate insulating layer 140, an intrinsic a-Si layer 150, and an extrinsic a-Si layer 160 are deposited in sequence on the gate lines 121 and the insulating substrate 110. The gate insulating layer 140 is made of, for example, silicon nitride with a thickness of about 2,500 Å to about 5,500 Å.

Figure 6:
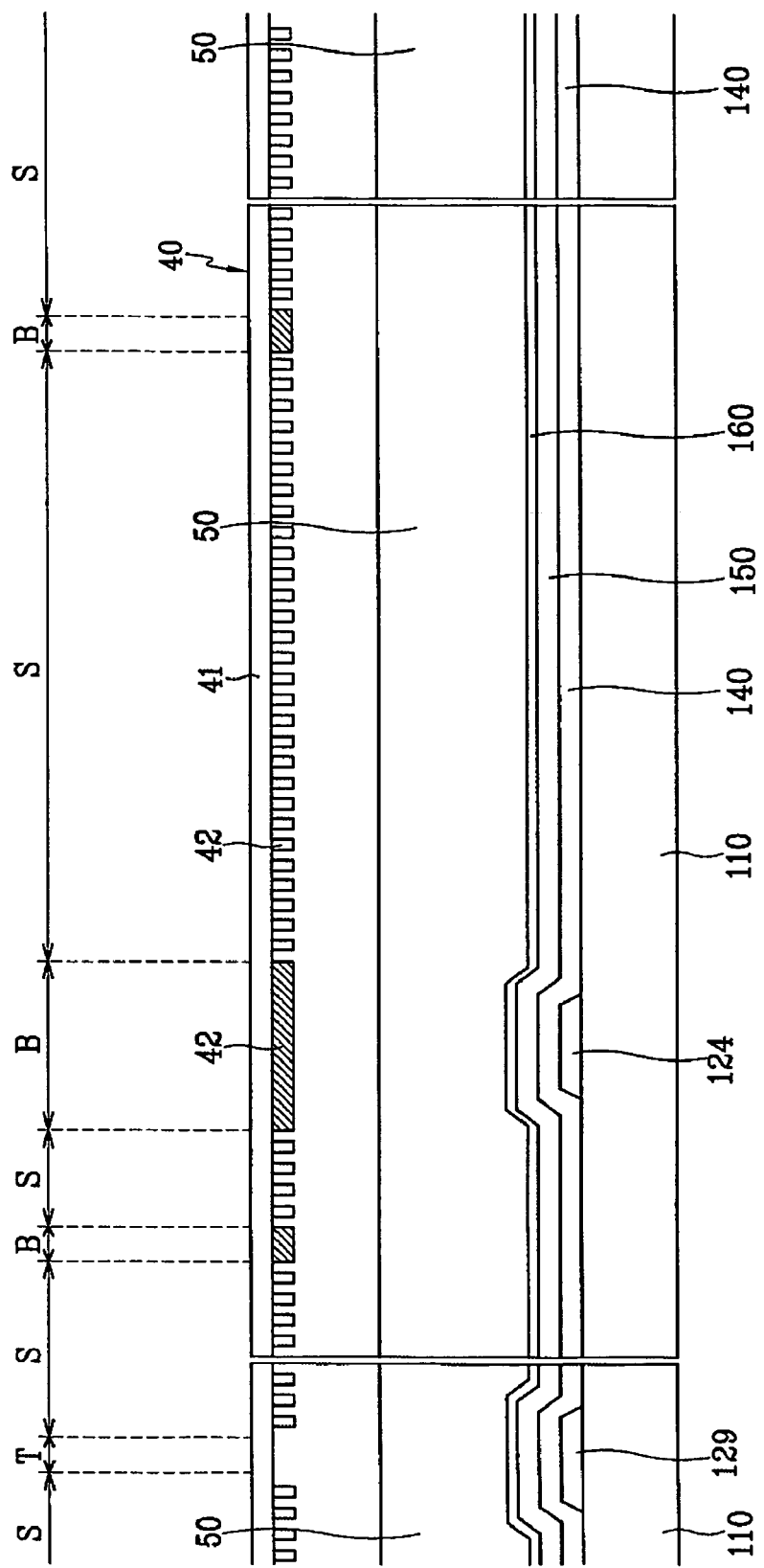
Figure 7:
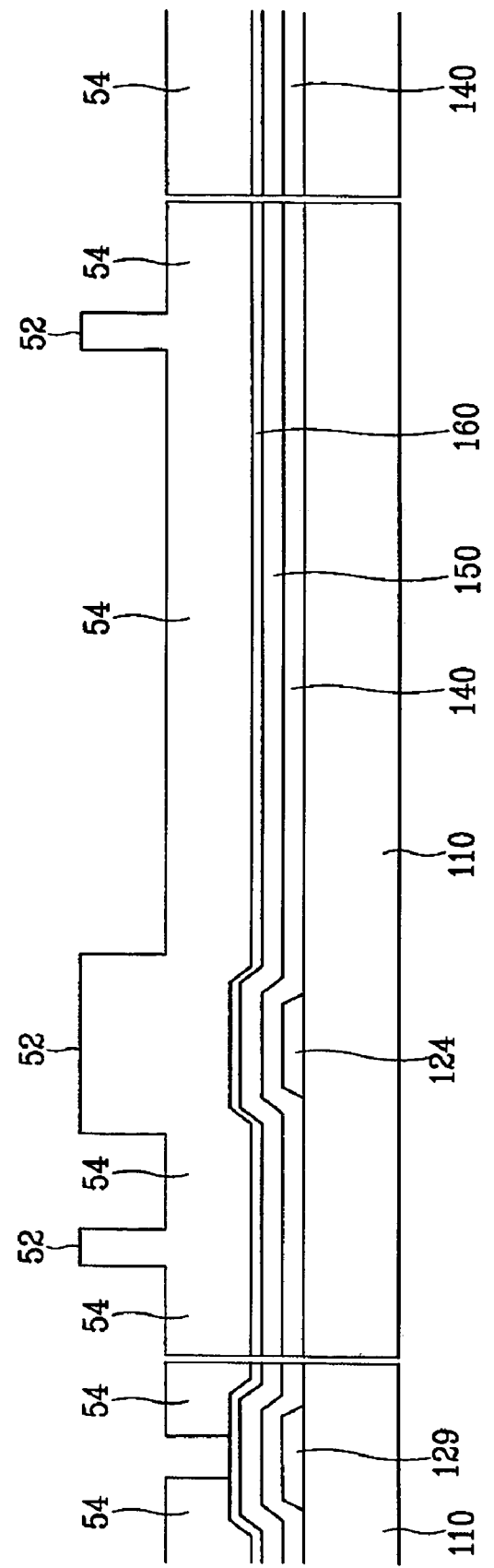

Referring to FIGS. 6 and 7, a photoresist film 50 is deposited on the extrinsic a-Si layer 160. Thereafter, the photoresist film 50 is exposed to light through an exposure mask 40 having a plurality of slits.

The exposure mask 40 includes a transparent substrate 41 and an opaque layer 42 on the transparent substrate 41. In addition, the exposure mask 40 is divided into light blocking areas B (in which light is blocked for a pre-determined width of the opaque layer 42), translucent areas S (in which the distance between the opaque layers 42 function as slits diffracting light for a pre-determined width between the opaque layers 42), and transparent areas T (in which light is directly passed through the transparent substrate 42 since there are no opaque layers 42 formed in a predetermined width thereon). The width of the slits or the distance between slits may be smaller than the resolution of a light exposer used for the photolithography.

The photoresist film 50 is exposed to the light through the exposure mask 40 and developed such that the developed photoresist has a position dependent thickness. The developed photoresist film shown in FIG. 7 includes a plurality of first to third portions, each with decreasing thickness. The first portions located on the light blocking areas B and the second portions located on translucent areas S are indicated by reference numerals 52 and 54, respectively, and no reference numeral is assigned to the third portions located on transparent areas T since they have substantially zero thickness in order to expose underlying portions of the extrinsic a-Si layer 160.

The position-dependent thickness of the developed photoresist is obtained by several techniques, for example, by providing translucent areas S on the exposure mask 40 as well as transparent areas T and light blocking opaque areas B. The translucent areas S may have a slit pattern, a lattice pattern, a thin film(s) with intermediate transmittance or intermediate thickness. When using a slit pattern, the width of the slits or the distance between the slits may be smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thicknesses of the portions 52 and 54 of the developed photoresist enable underlying layers to be selectively etched when using suitable process conditions. Therefore, as shown in FIGS. 8 to 10, a plurality of ohmic contact stripes 161 and 164, a plurality of semiconductor stripes 151 including a plurality of projections 154, and a plurality of contact holes 141 of the gate insulating layer 140 are obtained by a series of etching steps.

For descriptive purposes, portions of the extrinsic a-Si layer 160, the intrinsic a-Si layer 150, and gate insulating layer 140 within the light blocking areas B are referred to as first portions. Portions of the extrinsic a-Si layer 160, the intrinsic a-Si layer 150, and the gate insulating layer 140 within the translucent area S are referred to as second portions, and portions of the extrinsic a-Si layer 160, the intrinsic a-Si layer 150 and the gate insulating layer 140 within the transparent area T are referred to as third portions.

A process for forming such a structure will now be described.

Figure 8:
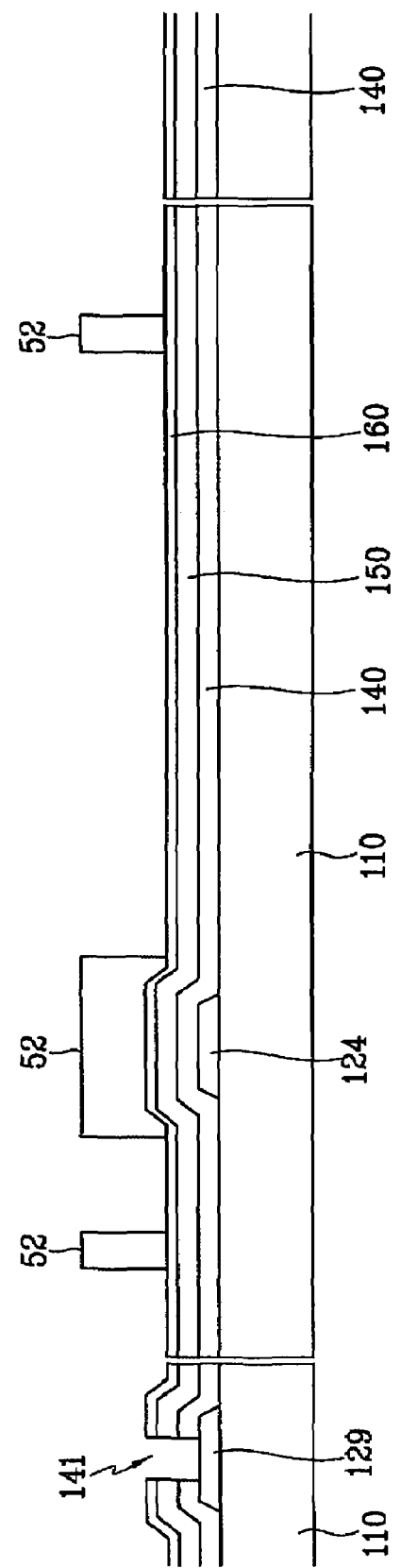

First, referring to FIG. 8, the third portion of the extrinsic a-Si layer 160 exposed to the transparent area T and the third portions of the underlying intrinsic a-Si 150 and the underlying gate insulating layer 140 of the extrinsic a-Si layer 160 are removed by dry-etching to form the contact holes 141 exposing the end portions 129 of the gate lines 121. In other words, each contact hole 141 exposes, in part, corresponding one of the end portions 129 of each gate line 121. At this time, the photoresists 52 and 54 may be etched under an etching condition with substantially equal etching ratio to remove the second portions 54 of the photoresist or decrease the thickness of that for the next etching step. Residue of the second portions 54 of the photoresist remaining on the translucent areas S is removed by ashing, thereby also removing the second portions of the extrinsic a-Si layer 160 on the translucent area S.

Referring to FIG. 9, a plurality of semiconductor stripes 151 (including projections 154) and ohmic contact stripes 161 and 164 are formed by removing the second portions of the extrinsic a-Si layer 160 and the intrinsic a-Si layer 150. The second portions are removed by dry etching; however, in order to prevent etching of the gate insulating layer 140, the a-Si layers 150 and 160 and the gate insulating layer 140 may be etched under an etching condition with the different etching ratio.

Subsequently, as shown in FIG. 10, the semiconductor stripes 151 (including projections 154) and the ohmic contact stripes 161 and 164 are further formed by removing the first portions 52 of the photoresist on the intrinsic a-Si layer 150 and the extrinsic a-Si layer 160. Each semiconductor stripe 151 extends substantially in a longitudinal direction of the TFT array panel. The projections 154 of the each semiconductor stripe 151 branch out toward the gate electrodes 124. In this embodiment, each projection 154 of the semiconductor stripe 151 has a size large enough to cover the gate electrode 124. The projection 154 of the semiconductor stripe 151 may cover a surrounding area of the gate electrode 124 as well, which includes a corresponding area of the gate line 121.

Referring now to FIGS. 11 and 12, a conductive film is sputtered on the gate insulating layer 140 and the ohmic contact stripes 161 and 164 and patterned by photo-etching to form a plurality of data lines 171 including a plurality of source electrodes 173, a plurality of drain electrodes 175, and a plurality of storage capacitor conductors 177.

Subsequently, a plurality of projections 163 and ohmic contact islands 165 are formed by removing an exposed region of the ohmic contact stripes which are not covered by the patterned conductive film. Each ohmic contact stripe 161 has a plurality of projections 163 that are disposed on the projections 154 of the semiconductor stripes 151. Ohmic contact islands 165 are formed on the projections 154 of the semiconductor stripes 151. A projection 163 of the semiconductor stripe 151 and an ohmic contact island 165 are disposed on a corresponding projection 154 of the semiconductor stripe 151. The lateral sides of each semiconductor stripe 151 and the ohmic contact stripes and islands 161 and 165 are inclined relative to a surface of the substrate 110. As a result, the projection 154 of each semiconductor stripe 151 has an exposed region corresponding to the removed region of each ohmic contact stripe between the source and drain electrodes 175 and 175. $O_2$ plasma may be performed by stabilizing the surface of the exposed region of the semiconductor stripes 151.

Referring FIG. 13, a lower passivation layer 801 made of, e.g., inorganic material, is formed on the data lines 171, the drain electrodes 175, the storage capacitor conductors 177, and the exposed portions of the semiconductor stripes 151. The lower passivation layer may have a thickness of about 1,000 Å to about 2,000 Å. Further the lower passivation layer may be formed by using, e.g., Chemical vapor deposition (CVD). An upper passivation layer 802 is formed on the lower passivation layer 801, and is made of photosensitive organic material. The upper passivation layer 802 is applied with a thickness of about 4,150 Å to about 4,250 Å. In case that the lower passivation layer 801 is omitted, the upper passivation layer 802 may be applied at any thickness except for the thickness of the lower passivation layer 801.

Referring now to FIG. 14, when the upper passivation layer 802 is exposed to light through an exposure mask (not shown), the contact holes 181, 182, 185 and 187 (contact hole 187 shown in FIG. 1) are formed. The lower passivation layer 801 thus has exposed areas at the contact holes.

Referring FIGS. 15 and 16, the exposed areas of the lower passivation layer 801 are removed by dry-etching. The upper passivation layer 802 is etched to a specified thickness. If the thickness of the lower passivation layer 801 is about 1,000 Å to 2,000 Å, the thickness of the upper passivation layer 802 is about 3,200 Å. In FIG. 16, the hatching portions indicate portions of the upper passivation layer 802 which are removed in the etching process. A thickness of such removed portions may be about 1,000 Å to 2,000 Å.

Meanwhile, since the contact holes 141 are already formed on the end portions 129 of the gate lines 121, it is not necessary to etch the gate insulating layer 140. Therefore, when the upper passivation layer 802 is applied, the thickness of the upper passivation layer 802 is thin as compared with prior art techniques since the consumption amount of the gate insulating layer 140 is not considered. In other words, since an etching process, which would have been performed with respect to the gate insulating layer in conventional techniques, is not necessitated, the beginning thickness of the upper passivation layer 802 may be decreased about to the thickness of the gate insulating layer 140, i.e., about 2.500 Å to 5,500 Å.

Accordingly, the consumption amount of organic material used for forming the upper passivation layer 802 may be decreased. In addition, if the thickness of the upper passivation layer 802 is thin, then realizing manufacturing characteristics such as evenness becomes simplified.

Moreover, in photolithography processes, since the thickness of the photosensitive organic layer, which requires an amount of light more than that of the generic photosensitive layer, becomes thin, the total amount of light is decreased about 10% (the generic photosensitive layer requires the amount of light about 60 mJ/cm$^2$ to 70 mJ/cm$^2$ and the photosensitive organic layer requires the amount of light about 260 mJ/cm$^2$ to 280 mJ/cm$^2$). In addition, since the required amount of light is decreased, the time exposed by light is lessened, thereby decreasing the tact time and improving productivity.

Moreover, organic material of the upper passivation layer 802 that has built up on the etching devices is removed by etching the gate insulating layer 140, thereby reducing the clean up period of the etching devices and improving productivity.

After the lower passivation layer 801 and the upper passivation layer 802 are patterned, the end portion 129 of each gate line, the end portion 179 of each data line, a portion of the drain electrode 175, and a portion of each storage capacitor conductor 177 are exposed through the contact holes 181, 182, 185, and 187, respectively, as shown in FIG. 16.

Finally, referring to FIGS. 1 and 2, a plurality of pixel electrodes 190 and a plurality of contact assistants 81 and 82 are formed on the lower and upper passivation layers 801 and 802 by sputtering and photo-etching using, for example, an ITO or IZO layer. The pixel electrodes 190 are physically and electrically connected to the drain electrodes 175 through the contact holes 185 and the storage capacitor conductors 177 through the contact holes 187 such that the pixel electrodes 190 receive the data voltages from the drain electrodes 175 and transmit the received data voltages to the storage capacitor conductors 177. The contact assistants 81 and 82 are connected to the exposed end portions 129 of the gate lines 121 and the expose end portions 179 of the data lines 171 through the contact holes 181 and 182, respectively.

Since the manufacturing method of the TFT array panel according to an embodiment simultaneously forms the contact holes 141 of the gate insulating layer 140 and the semiconductor stripes 151, the thickness of the passivation layers 801 and 802 becomes thin thereby decreasing the costs of production and the manufacturing time.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor panel, the method comprising:
   forming a first signal line on a substrate;
   forming in sequence a first insulating layer and a semiconductor layer on the first signal line;

patterning the semiconductor layer and the first insulating layer through one photolithography process to form a patterned semiconductor layer and a patterned first insulating layer having a first contact hole to expose a portion of the first signal line; and forming a second signal line on the patterned semiconductor layer and the patterned first insulating layer.

2. The method of claim 1, further comprising:
applying a second insulating layer on the second signal line; and
patterning the second insulating layer.

3. The method of claim 2, wherein the second insulating layer is made of organic material.

4. The method of claim 3, wherein a thickness of the first insulating layer is about 2,500 Å to 5,500 Å.

5. The method of claim 3, further comprising:
forming a third insulating layer made of inorganic material under the second insulating layer.

6. The method of claim 5, wherein the second and third insulating layers are patterned through one photolithography process.

7. The method of claim 6, wherein the second insulating layer has photosensitivity.

8. The method of claim 7, wherein a difference between a thickness of the second insulating layer before and after the patterning of the second and third insulating layers is about 1,000 Å to 2,000 Å.

9. The method of claim 8, wherein a thickness of the first insulating layer is about 2,500 Å to 5,500 Å, a thickness of the second insulating layer before the patterning of the second and third insulating layers is about 4,150 Å to 4,250 Å, and a thickness of the third insulating layer is about 1,000 Å to 2,000 Å.

10. The method of claim 3, further comprising:
forming a second contact hole in the second insulating layer to expose the portion of the first signal line.

11. The method of claim 10, further comprising forming a third contact hole in the second insulating layer to expose a portion of the second signal line.

12. The method of claim 11, further comprising forming a pixel electrode on the second insulating layer, the pixel electrode being connected with the exposed portion of the second signal line via the third contact hole.

13. The method of claim 11, further comprising forming a contact assistant on the second insulating layer, the contact assistant being connected with the exposed portion of the first signal line via the first and second contact holes.

14. A method of manufacturing a thin film transistor panel, the method comprising:
forming a first signal line on a substrate;
forming in sequence a first insulating layer and a semiconductor layer on the first signal line;
patterning the semiconductor layer and the first insulating layer through one photolithography process to form a patterned semiconductor layer and a patterned first insulating layer, the patterned first insulating layer having a first contact hole to expose a portion of the first signal line;

forming a second signal line on the patterned semiconductor layer and the patterned insulating layer;
applying a second insulating layer on the second signal line; and
patterning the second insulating layer to have a second contact hole at the substantially same location as the first contact hole.

15. The method of claim 14, wherein the patterning of the semiconductor layer and the first insulating layer comprises:
applying a photosensitive layer on the semiconductor layer;
forming the first contact hole by etching the semiconductor layer and the first insulating layer using the photosensitive layer as an etching mask; and
removing the photosensitive layer.

16. The method of claim 14, wherein the patterning of the semiconductor layer and the first insulating layer comprises:
applying a photosensitive layer on the semiconductor layer;
exposing to light the photosensitive layer through a mask having a slit pattern;
developing the photosensitive layer;
forming the first contact hole by etching the semiconductor layer and the first insulating layer using the photosensitive layer as an etching mask; and
removing the photosensitive layer.

17. The method of claim 14, wherein the semiconductor layer has an intrinsic semiconductor layer and an extrinsic semiconductor layer.

18. The method of claim 14, wherein the second insulating layer is made of organic material.

19. The method of claim 15, further comprising applying a third insulating layer made of inorganic material under the second insulating layer.

20. The method of claim 19, further comprising exposing to light the first signal line through the first contact hole by removing the third insulating layer exposed after patterning the second insulating layer.

21. The method of claim 20, wherein the second insulating layer has photosensitivity.

22. The method of claim 21, wherein a difference between a thickness of the second insulating layer before and after the third insulating layer is patterned is about 1,000 Å to 2,000 Å.

23. The method of claim 22, wherein a thickness of the first insulating layer is about 2,500 Å to 5,500 Å, a thickness of the second insulating layer in the applying step of the second insulating layer is about 4,150 Å to 4,250 Å, and a thickness of the third insulating layer is about 1,000 Å to 2,000 Å.

24. The method of claim 20, further comprising forming a contact assistant on the second insulating layer, the contact assistant being connected with the exposed portion of the first signal line.

25. The method of claim 14, further comprising forming a pixel electrode on the second insulating layer.

* * * * *